United States Patent
Sun et al.

(10) Patent No.: US 10,332,745 B2
(45) Date of Patent: Jun. 25, 2019

(54) DUMMY ASSIST FEATURES FOR PATTERN SUPPORT

(71) Applicant: GLOBALFOUNDRIES Inc., Grand Cayman (KY)

(72) Inventors: Lei Sun, Albany, NY (US); Ruilong Xie, Niskayuna, NY (US); Wenhui Wang, San Jose, CA (US); Yulu Chen, Troy, NY (US); Erik Verduijn, Rensselaer, NY (US); Zhengqing John Qi, Albany, NY (US); Guoxiang Ning, Ballston Lake, NY (US); Daniel J. Dechene, Watervliet, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/597,277

(22) Filed: May 17, 2017

(65) Prior Publication Data

US 2018/0337045 A1    Nov. 22, 2018

(51) Int. Cl.
*H01L 21/027* (2006.01)
*H01L 21/033* (2006.01)
*H01L 21/768* (2006.01)
*H01L 21/3065* (2006.01)

(52) U.S. Cl.
CPC ...... *H01L 21/0338* (2013.01); *H01L 21/0276* (2013.01); *H01L 21/3065* (2013.01); *H01L 21/76879* (2013.01)

(58) Field of Classification Search
CPC .......... H01L 21/0274; H01L 21/76819; H01L 21/0338; H01L 21/0276; H01L 21/76879; H01L 21/3065; G03F 1/70

USPC ......................... 257/773, 202, 437, E21.314
See application file for complete search history.

(56) References Cited

U.S. PATENT DOCUMENTS

| | | | |
|---|---|---|---|
| 2003/0235948 A1* | 12/2003 | Park | H01L 21/76897 438/253 |
| 2005/0277276 A1 | 12/2005 | Stephens et al. | |
| 2007/0077500 A1 | 4/2007 | Baidya et al. | |
| 2009/0053657 A1* | 2/2009 | Hatakeyama | C09D 133/066 430/324 |
| 2010/0193960 A1 | 8/2010 | Mashita et al. | |
| 2012/0032266 A1* | 2/2012 | Inoue | H01L 21/0337 257/365 |
| 2016/0118388 A1* | 4/2016 | Tonari | H01L 29/4236 438/253 |

FOREIGN PATENT DOCUMENTS

KR    20100038629 A    4/2010

\* cited by examiner

*Primary Examiner* — Jasmine J Clark
(74) *Attorney, Agent, or Firm* — Thompson Hine LLP; Anthony Canale

(57) ABSTRACT

Methods of forming printed patterns and structures formed using printed patterns. A first line and a second line are lithographically printed in a first layer composed of photoimageable material with a space arranged between the first line and the second line. A dummy assist feature is also lithographically printed in the photoimageable material of the first layer. A second layer underlying the first layer is etched with the first line, the second line, and the dummy assist feature present as an etch mask. The dummy assist feature is arranged on a portion of the space adjacent to the first line and supports the photoimageable material of the first line during etching.

17 Claims, 3 Drawing Sheets

DUMMY ASSIST FEATURES FOR PATTERN SUPPORT

BACKGROUND

The present invention relates to semiconductor device fabrication and integrated circuits and, more specifically, to structures for printing patterns and methods of forming printed patterns.

Lithography techniques, such as optical proximity correction (OPC), may be used in an attempt to alleviate mask transfer problems. In OPC, non-printing dummy assist features, also known as sub-resolution dummy assist features (SRAFs), are placed on the photomask pattern to enhance the printability of the main features on the photomask pattern. Because SRAF's are non-printing, these dummy assist features of the photomask are not replicated in a photoresist on a wafer.

As pitch shrinks, the aspect ratio of depth to width for a line/space (L/S) pattern increases. With the increased aspect ratio, the risk of pattern collapse during either lithography or etching increases. This increased risk of pattern collapse can be offset by reducing the thickness of the photoresist and/or the thickness of the film being etched in order to reduce the aspect ratio. However, etch selectivity suffers with such thickness reductions.

SUMMARY

In embodiments of the invention, a method includes lithographically printing, in a first layer composed of photoimageable material, a first line, a second line, and a space between the first line and the second line. The method further includes lithographically printing a dummy assist feature in the photoimageable material of the first layer. A second layer underlying the first layer is etched with the first line, the second line, and the dummy assist feature present as an etch mask. The dummy assist feature is arranged on a portion of the space adjacent to the first line and supports the photoimageable material of the first line during etching.

In embodiments of the invention, a structure includes a first linear feature, a second linear feature arranged relative to the first linear feature and separated from the first linear feature by a space, and a dummy assist feature is associated with a first portion of the space adjacent to the first linear feature. The first linear feature and the second linear feature are semiconductor fins or interconnects.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
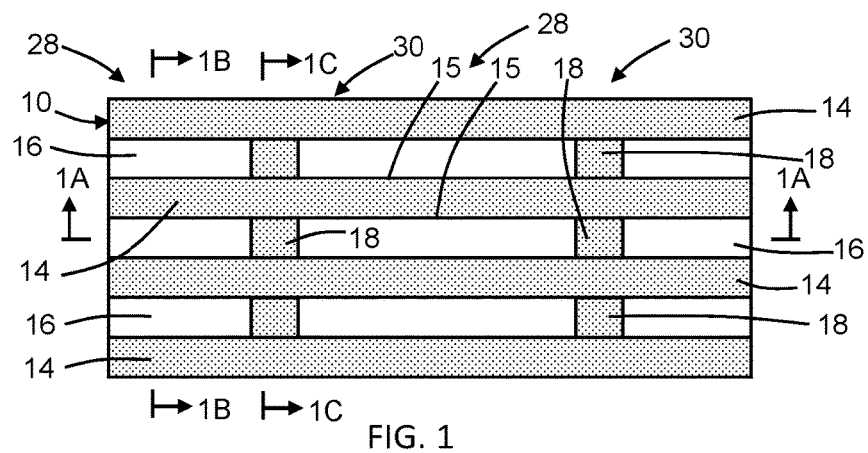
FIG. 1 is a top view of a structure at an initial fabrication stage of a processing method in accordance with embodiments of the invention.

With reference to FIGS. 1, 1A, 1B, 1C and in accordance with embodiments of the invention, lines 14 and dummy assist features 18 of an etch mask 10 are formed on an underlying layer 12. The lines 14 and dummy assist features 18 of the etch mask 10 may be formed from, for example, an anti-reflective coating deposited by chemical vapor deposition (CVD) and a layer composed of photoimageable or photosensitive material (e.g., a photoresist) that is applied, pre-baked, exposed to a radiation projected through a photomask, baked after exposure, and developed with a chemical developer. The dummy assist features 18 are printed by the lithography process in the photoresist and, therefore, appear in the etch mask 10. The size of the dummy assist features 18 and their printability may be optimized by Resolution Enhancement Technology (RET) during lithography, such as the inclusion of non-printable sub-resolution dummy assist features (SRAFs) in the features on the photomask. The layer 12 may be composed of a single-crystal semiconductor material, such as an epitaxial layer of single-crystal silicon or silicon-germanium, or a polycrystalline semiconductor material, such as polycrystalline silicon (i.e., polysilicon), and may be located on an underlying substrate 11.

The lines 14 may be linear features that have a parallel arrangement, and that are formed with a given pitch. However, dummy assist features 18 may be associated with non-linear features that lack a parallel arrangement. The lines 14 are separated by spaces 16 that are interdigitated with the lines 14. The pitch determines a line/space (L/S) pattern for the lines 14 and spaces 16. The lines 14 include opposite sidewalls in the form of side surfaces 15 that border the adjacent spaces 16. The side surfaces 15 may be planar and parallel with each other. The dummy assist features 18 extend outwardly from the side surfaces 15 of the lines 14 into the spaces 16 between the lines 14.

The dummy assist features 18 in the etch mask 10 may bridge across the space 16 separating adjacent lines 14 by extending across the entire width of the associated space 16 such that the respective side surfaces 15 of adjacent pairs of lines 14 are connected. Alternatively, the dummy assist features 18 may only extend partially across the space 16 between the respective side surfaces 15 of adjacent lines 14. In this instance, the dummy assist features 18 are only connected to the side surface 15 of one or the other of each pair of adjacent lines 14.

In the representative embodiment, the dummy assist features 18 on the side surface 15 of the different lines 14 are grouped together along the length of the lines 14 to ease or simplify a subsequent removal process. The grouping is arranged such that the etch mask 10 will include active patterns of lines 14, generally indicated by reference numeral 28, that lack dummy assist features 18 and non-active patterns of lines 14, generally indicated by reference numeral 30, that include dummy assist features 18. However, embodiments of present invention are not limited in this aspect and the dummy assist features 18 may be spread around or distributed in a different manner instead of being grouped to form the active patterns 28 and non-active patterns 30.

Figure 1A:
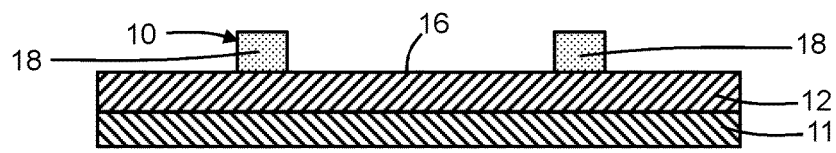
FIG. 1A is a cross-sectional view taken generally along line 1A-1A in FIG. 1.
Figure 1B:
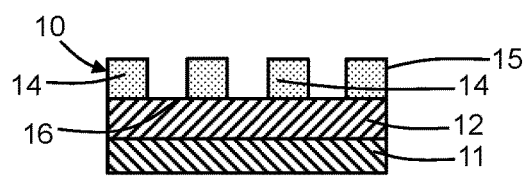
FIG. 1B is a cross-sectional view taken generally along line 1B-1B in FIG. 1.
Figure 1C:
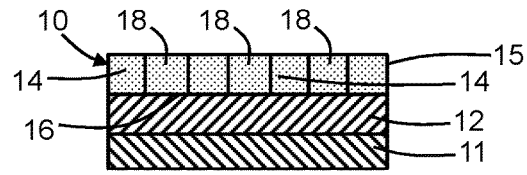
FIG. 1C is a cross-sectional view taken generally along line 1C-1C in FIG. 1.
Figure 2:
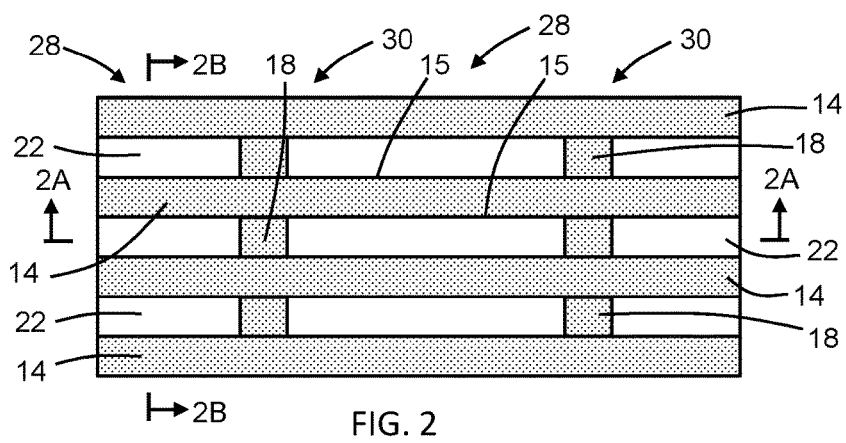
FIG. 2 is a top view of the structure at a fabrication stage of the processing method subsequent to FIG. 1.
Figure 2A:
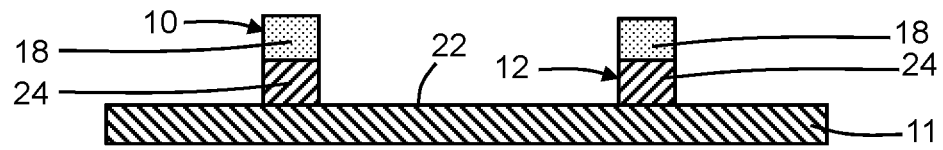
FIG. 2A is a cross-sectional view taken generally along line 2A-2A in FIG. 2.
Figure 2B:
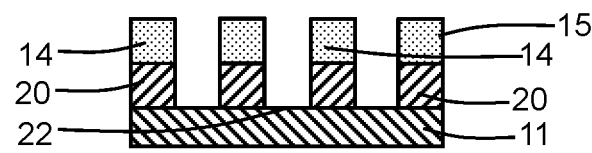
FIG. 2B is a cross-sectional view taken generally along line 2B-2B in FIG. 2.

With reference to FIGS. 2, 2A, 2B in which like reference numerals refer to like features in FIGS. 1, 1A, 1B and at a subsequent fabrication stage, the layer 12 is patterned with the etch mask 10 present. The layer 12 may be patterned using a subtractive etching process with sections of the layer 12 masked by the lines 14 and dummy assist features 18 of the etch mask 10. The etching process may be a directional etching process, such as reactive ion etching (RIE), that patterns the layer 12 to form lines 20 and features 24 with geometries, areas, and locations determined by the lines 14 and dummy assist features 18 of the etch mask 10. In particular, the dummy assist features 18 are printed by the etching process in the layer 12 as the features 24. The dummy assist features 18 enhance the mechanical stability of the lines 14 of the etch mask 10 and the lines 20 of the layer 12 during etching and may aid in the prevention of pattern collapse of active patterns by providing pattern support. The groupings of active patterns 28 and non-active patterns 30 in the etch mask 10 are transferred to the patterned layer 12.

Figure 3:
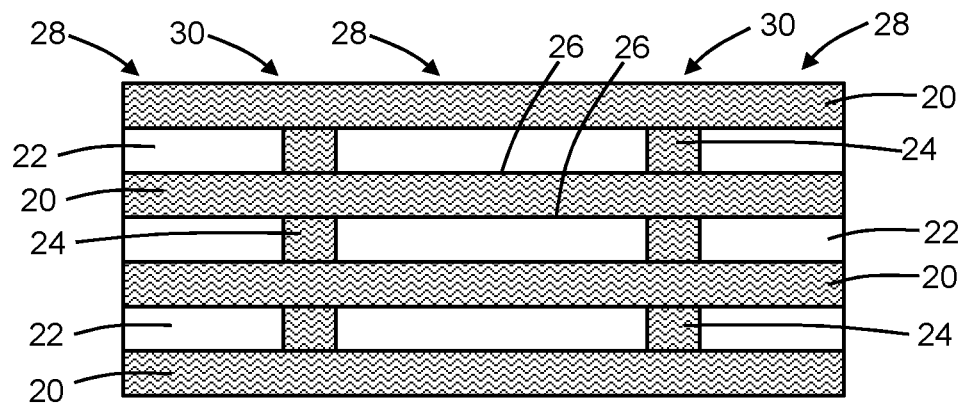
FIG. 3 is a top view of the structure at a fabrication stage of the processing method subsequent to FIG. 2.

With reference to FIG. 3 in which like reference numerals refer to like features in FIGS. 2, 2A, 2B and at a subsequent fabrication stage, the etch mask 10 is removed, after the underlying layer 12 is patterned, to reveal the patterned layer 12. The pattern of lines 20 and features 24 is a reproduction of the pattern of lines 14 and dummy assist features 18 of the etch mask 10 such that the lines 20 and features 24 formed in layer 12 are correlated in position with the lines 14 and dummy assist features 18 of the etch mask 10. The lines 20 are linear features that have a parallel arrangement, and are separated by spaces 22 that are interdigitated with the lines 20 and likewise have a parallel arrangement. The lines 20 and spaces 22 are characterized by a line/space (L/S) pattern that is identical to the L/S pattern of the lines 14 and spaces 16 of the etch mask 10.

The lines 20 include opposite sidewalls in the form of side surfaces 26 that border the adjacent spaces 22. The features 24 extend outwardly from the side surfaces 26 of the lines 20 into the spaces 22 between the lines 20. In the representative embodiment, the features 24 on the different lines 20 are grouped together along the length of the lines 20 in the active patterns 28 and non-active patterns 30. The features 24 in the patterned layer 12 may bridge across the space 22 separating the side surfaces 26 of adjacent lines 20 by extending across the entire width of the space 22 such that the respective side surfaces 26 of adjacent pairs of lines 20 are connected.

Figure 4:
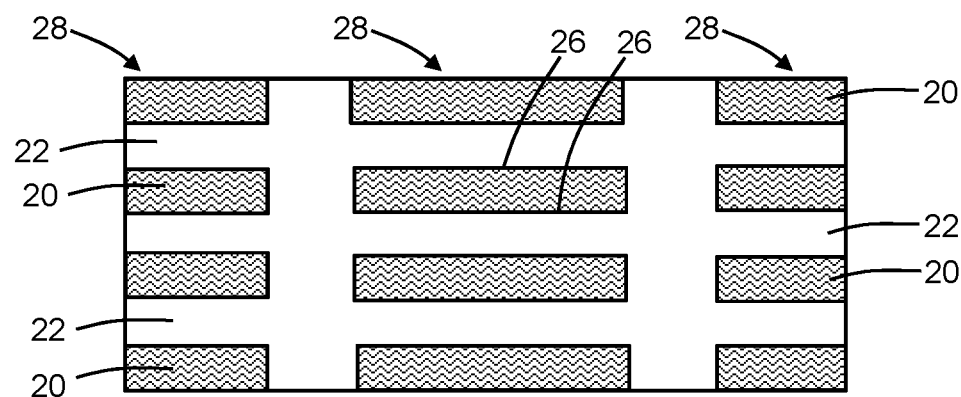
FIG. 4 is a top view of the structure at a fabrication stage of the processing method subsequent to FIG. 3.

With reference to FIG. 4 in which like reference numerals refer to like features in FIG. 3 and at a subsequent fabrication stage, the lines 20 may be used in the formation of functional device structures, such as field-effect transistors, fabricated by front-end-of-line (FEOL). In an embodiment, the lines 20 may be fins that are used in the fabrication of fin-type field-effect transistors. The lines 20 in the active patterns 28 are eventually incorporated into the functional device structures, and the lines 20 and features 24 in the non-active patterns 30 may be removed. For example, a cut mask (not shown) may be applied that includes an opening aligned with the non-active patterns 30 of lines 20 and features 24, and then an etching process may be used to cut the non-active patterns 30 while the active patterns 28 of lines 20 are masked by the cut mask. The grouping, location, and dimensions of the dummy assist features 18 in the etch mask 10 may be chosen in conjunction with the size and location of the cut mask openings to provide the removal of the non-active patterns 30 and the associated features 24. Alternatively, the lines 20 may be cut using the cut mask to separate the lines 20 in the active patterns 28 from the lines 20 and features 24 in the non-active patterns 30 without removing the features 24.

Figure 5:
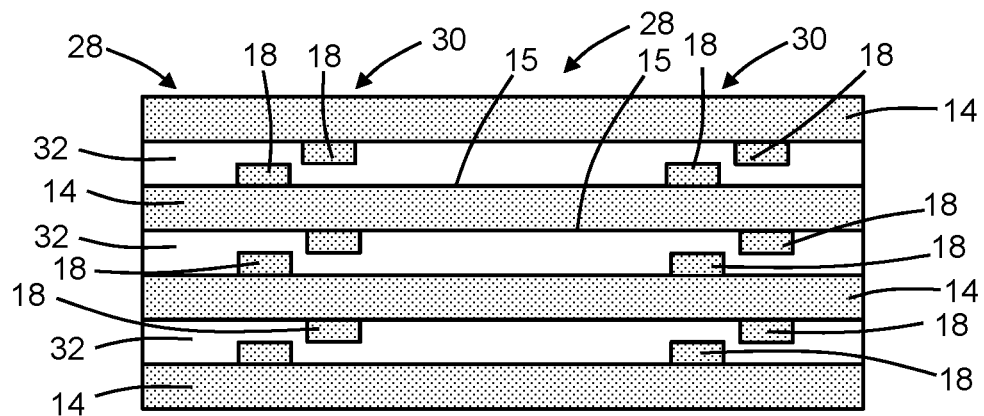
FIG. 5 is a top view of a structure similar to FIG. 3 in accordance with alternative embodiments of the invention.

With reference to FIG. 5 in which like reference numerals refer to like features in FIG. 4 and in alternative embodiments of the invention, the layer 12 underlying the etch mask 10 may be comprised of a different type of material. For example, the layer 12 may be comprised of an electrically-insulating dielectric material, such as hydrogen-enriched silicon oxycarbide (SiCOH) or another type of low-k dielectric material. As described hereinabove, the pattern of lines 14 and dummy assist features 18 is formed in the etch mask 10 and transferred by an etching process to form a corresponding pattern of trenches 32 as features in the dielectric material of the layer 12 during back-end-of-line (BEOL) processing. The layer 12 is not etched where covered by the lines 14 and dummy assist features 18 of the etch mask 10.

Multiple dummy assist features 18 may be arranged adjacent to each other between the side surfaces 15 of the lines 14. In particular, the arrangement and grouping of the dummy assist features 18 in the etch mask 10 may be adjusted such that, for any pair of lines 14, one of the dummy assist features 18 extends from the side surface 15 of one of the lines 14 and another dummy assist feature 18 projects from the side surface 15 of the adjacent line 14. In such an embodiment, the dummy assist features 18 only extend from the side surface 15 of one or the other of the adjacent lines 14 and are sized to only extend partially across the width of the space between the respective side surfaces 15 of adjacent lines 14. The misalignment of the dummy assist features 18 on the facing side surfaces 15 ensures that the dummy assist features 18 are arranged in a non-touching relationship while maintaining proximity for grouping. The dimensions of the dummy assist features 18 in a direction parallel to the line length and/or in a direction transverse to the line length may each vary from two (2) nanometers to one thousand (1000) nanometers as permitted by lithography and etching processes or as permitted by a design rule. The dummy assist features 18 may have any location so long as the dummy assist features 18 are located outside of the working area of active patterns 28.

Figure 6:
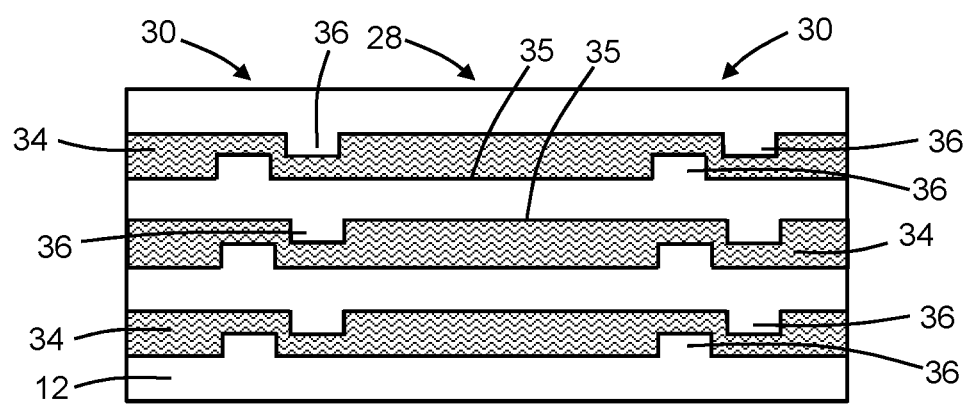
FIG. 6 is a top view of the structure at a fabrication stage of the processing method subsequent to FIG. 5.

With reference to FIG. 6 in which like reference numerals refer to like features in FIG. 5 and at a subsequent fabrication stage, the trenches 32 are filled with a conductor to form lines 34 representing interconnects (e.g., wires) of a metallization level of a BEOL interconnect structure. A liner (not shown) comprised of titanium (Ti), titanium nitride (TiN), tantalum (Ta), tantalum nitride (TaN), or a layered combination of these materials (e.g., a bilayer of Ti/TiN) may be applied to the trenches 32 before filling with the metal. The lines 34 may be comprised of a low-resistivity conductor, such as copper (Cu), aluminum (Al), or cobalt (Co).

The lines 34 have opposite sidewalls in the form of side surfaces 35 that are vertically correlated in location with the side surfaces 15 of the lines 14 in the etch mask 10. The dummy assist features 18 result in the formation of notches 36 as indentations into the side surfaces 35 of the lines 34.

The patterned layer 12 will include active patterns 28 of lines 20 that lack notches 36 and non-active patterns 30 of lines 20 that include notches 36 that indent the side surfaces 35.

Figure 7:
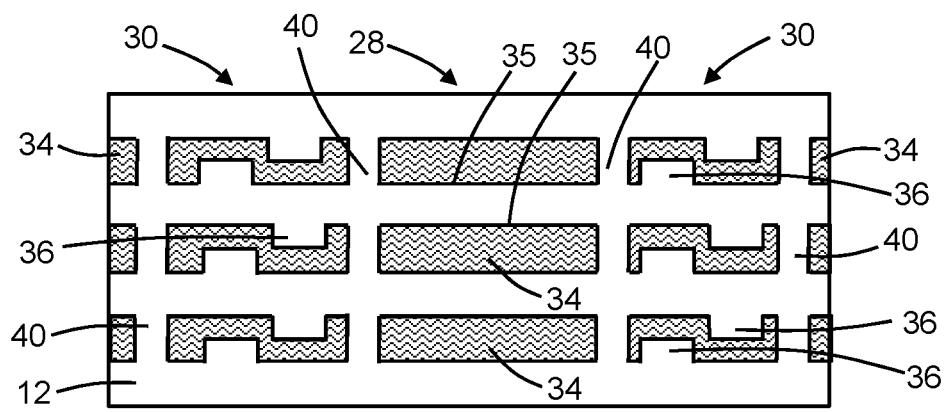
FIG. 7 is a top view of the structure at a fabrication stage of the processing method subsequent to FIG. 6.

With reference to FIG. 7 in which like reference numerals refer to like features in FIG. 6 and at a subsequent fabrication stage, a cut mask (not shown) may be applied, and an etching process used to cut the lines 34 and thereby introduce discontinuities 40 along the lengths of the respective lines 34. Although the non-active patterns of lines 34 are not cut, the non-active patterns of lines 34 are separated and segregated from the active patterns of lines 34 by the discontinuities 40 defined by the cuts. The grouping, location, and dimensions of the dummy assist features 18 in the etch mask 10 may be chosen in conjunction with the locations of the discontinuities 40 to provide the pattern isolation.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product. For example, the field-effect transistor and/or handle wafer contact in the embodiments described herein may be used in a switch, a low noise amplifier, or a logic circuit.

References herein to terms such as "vertical", "horizontal", "lateral", etc. are made by way of example, and not by way of limitation, to establish a frame of reference. Terms such as "horizontal" and "lateral" refer to a direction in a plane parallel to a top surface of a semiconductor substrate, regardless of its actual three-dimensional spatial orientation. Terms such as "vertical" and "normal" refer to a direction perpendicular to the "horizontal" and "lateral" direction. Terms such as "above" and "below" indicate positioning of elements or structures relative to each other and/or to the top surface of the semiconductor substrate as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
    lithographically printing, in a first layer composed of photoimageable material, a first line, a second line, a space between the first line and the second line, and a first dummy assist feature arranged on a first portion of the space adjacent to the first line; and
    etching a second layer underlying the first layer with the first line, the second line, and the first dummy assist feature present as an etch mask,
    wherein the first dummy assist feature supports the photoimageable material of the first line during etching.

2. The method of claim 1 wherein the first line has a sidewall, the second line has a sidewall, and the first dummy assist feature extends across the space from the sidewall of the first line to the sidewall of the second line.

3. The method of claim 2 wherein the first line is arranged parallel to the second line.

4. The method of claim 1 wherein the first line has a sidewall, the second line has a sidewall, and the first dummy assist feature extends partially across the space from the sidewall of the first line toward the sidewall of the second line.

5. The method of claim 4 wherein the first line is arranged parallel to the second line.

6. The method of claim 1 comprising:
    printing a second dummy assist feature in the photoimageable material of the first layer,
    wherein the second dummy assist feature is arranged on a second portion of the space adjacent to the second line and supports the photoimageable material of the second line during etching.

7. The method of claim 6 wherein the second dummy assist feature is spaced along a length of the second line from the first dummy assist feature.

8. The method of claim 6 wherein the first line has a sidewall, the second line has a sidewall, the first dummy assist feature extends partially across the space from the sidewall of the first line toward the sidewall of the second line, and the second dummy assist feature extends partially across the space from the sidewall of the second line toward the sidewall of the first line.

9. The method of claim 1 wherein, before etching, the space is an area located on a top surface of the second layer.

10. The method of claim 7 wherein the first line, the second line, the space, and the first dummy assist feature comprise a pattern formed in the photoimageable material of the first layer, and etching the second layer underlying the first layer comprises:
    transferring the pattern from the first layer to the second layer to form a pattern in the second layer that includes a first line, a second line, and a feature underlying the first dummy assist feature of the first layer.

11. The method of claim 10 wherein the feature is located between a section of the first line of the second layer and a section of the second line of the second layer, and comprising:
    removing the feature of the second layer, the section of the first line of the second layer, and the section of the second line of the second layer.

12. The method of claim 10 wherein the first line includes a first section and a second section, the first portion of the space is arranged adjacent to the first section, and comprising:
    cutting the first line to isolate the first section of the first line from the second section of the first line.

13. The method of claim 1 wherein the second layer is comprised of a low-k dielectric material, and etching the second layer underlying the first layer comprises:
  forming a trench in the low-k dielectric material between the first line and the second line during etching,
  wherein the first dummy assist feature masks the low-k dielectric material over an area when the trench is formed.

14. The method of claim 13 further comprising:
  filling the trench with a conductor to form an interconnect,
  wherein the interconnect includes a notch at the area masked by the first dummy assist feature.

15. The method of claim 13 wherein the first line has a sidewall, the second line has a sidewall, and the first dummy assist feature extends partially across the space from the sidewall of the first line toward the sidewall of the second line.

16. The method of claim 1 wherein the second layer is composed of a semiconductor material, and etching the second layer underlying the first layer comprises:
  forming a first semiconductor fin correlated in position with the first line and a second semiconductor fin correlated in position with the second line,
  wherein a feature is located in the space between the first semiconductor fin and the second semiconductor fin and is correlated in position with the first dummy assist feature.

17. The method of claim 1 wherein the first dummy assist feature is transferred during etching to the second layer and forms a feature in the second layer over an area of the first portion of the space.

* * * * *